United States Patent
Yamamoto et al.

(10) Patent No.: US 8,866,119 B2
(45) Date of Patent: Oct. 21, 2014

(54) MEMORY DEVICE AND METHOD FOR MANUFACTURING SAME

(75) Inventors: Kazuhiko Yamamoto, Kanagawa-ken (JP); Kenji Aoyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 13/051,264

(22) Filed: Mar. 18, 2011

(65) Prior Publication Data

US 2012/0097914 A1    Apr. 26, 2012

(30) Foreign Application Priority Data

Oct. 20, 2010 (JP) .................................. 2010-235173

(51) Int. Cl.
| | |
|---|---|
| *H01L 29/04* | (2006.01) |
| *H01L 47/00* | (2006.01) |
| *H01L 29/06* | (2006.01) |
| *H01L 27/24* | (2006.01) |
| *H01L 45/00* | (2006.01) |
| *G11C 13/00* | (2006.01) |
| *G11C 13/02* | (2006.01) |

(52) U.S. Cl.
CPC ............ *H01L 45/04* (2013.01); *G11C 13/0014* (2013.01); *H01L 27/2409* (2013.01); *H01L 27/2463* (2013.01); *H01L 45/1675* (2013.01); *G11C 2213/71* (2013.01); *G11C 2213/16* (2013.01); *G11C 2213/72* (2013.01); *H01L 45/149* (2013.01); *H01L 45/145* (2013.01); *H01L 45/1233* (2013.01); *G11C 13/025* (2013.01); *H01L 27/2481* (2013.01)
USPC ............................. 257/3; 257/5; 257/E45.002

(58) Field of Classification Search
USPC ........................................................ 257/2–5
See application file for complete search history.

(56) References Cited

U.S. PATENT DOCUMENTS

| | | | | |
|---|---|---|---|---|
| 2008/0017842 | A1* | 1/2008 | Happ et al. ........................ | 257/4 |
| 2009/0134451 | A1* | 5/2009 | Baik et al. ..................... | 257/325 |
| 2009/0166610 | A1 | 7/2009 | Schricker et al. | |
| 2009/0256129 | A1* | 10/2009 | Scheuerlein ..................... | 257/4 |
| 2009/0278112 | A1 | 11/2009 | Schricker et al. | |
| 2010/0006812 | A1* | 1/2010 | Xu et al. .......................... | 257/2 |
| 2010/0108982 | A1* | 5/2010 | Ping et al. ........................ | 257/5 |
| 2010/0237319 | A1 | 9/2010 | Satoh et al. | |
| 2010/0245029 | A1* | 9/2010 | Schricker et al. ............... | 338/13 |

(Continued)

FOREIGN PATENT DOCUMENTS

JP        2009-49183 A        3/2009

OTHER PUBLICATIONS

U.S. Appl. No. 13/018,765, filed Feb. 1, 2011, Aoyama et al.
U.S. Appl. No. 13/019,630, filed Feb. 2, 2011, Yamamoto et al.

(Continued)

*Primary Examiner* — Daniel Luke
*Assistant Examiner* — Khaja Ahmad
(74) *Attorney, Agent, or Firm* — Oblon, Spivak, McClelland, Maier & Neustadt, L.L.P.

(57) ABSTRACT

According to one embodiment, a memory device includes a selection element layer, a nanomaterial aggregate layer, and a fine particle. The nanomaterial aggregate layer is stacked on the selection element layer. The nanomaterial aggregate layer has a plurality of micro conductive bodies aggregated with an interposed gap. The fine particle has at least a surface made of silicon oxynitride. The fine particle is dispersed between the micro conductive bodies in one portion of the nanomaterial aggregate layer piercing the nanomaterial aggregate layer in a thickness direction.

7 Claims, 10 Drawing Sheets

(56) References Cited

U.S. PATENT DOCUMENTS

| | | | |
|---|---|---|---|
| 2011/0049463 A1 | 3/2011 | Yamamoto et al. | |
| 2011/0068313 A1* | 3/2011 | Liu | 257/4 |
| 2011/0133151 A1* | 6/2011 | Li et al. | 257/4 |
| 2011/0194304 A1* | 8/2011 | Han et al. | 362/555 |

OTHER PUBLICATIONS

U.S. Appl. No. 12/956,548, filed Nov. 30, 2010, Yamamoto et al.

Office Action issued Mar. 7, 2014, in Japanese Patent Application No. 2010-235173 with English translation.

* cited by examiner

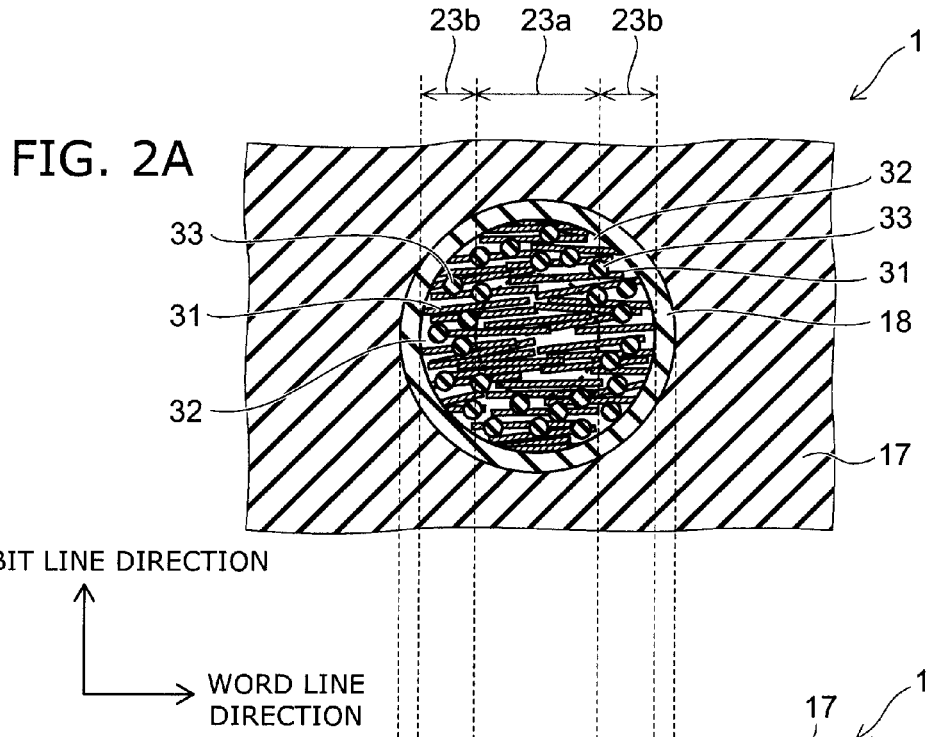
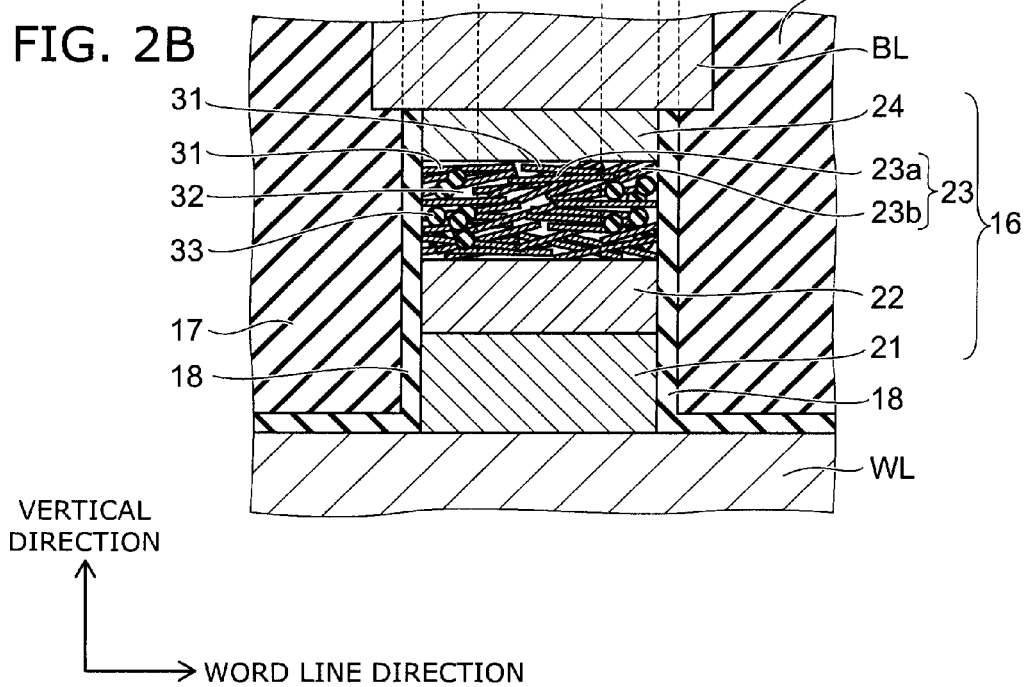

BIT LINE DIRECTION ↑ → WORD LINE DIRECTION

VERTICAL DIRECTION ↑ → WORD LINE DIRECTION

BIT LINE DIRECTION → WORD LINE DIRECTION

VERTICAL DIRECTION → WORD LINE DIRECTION

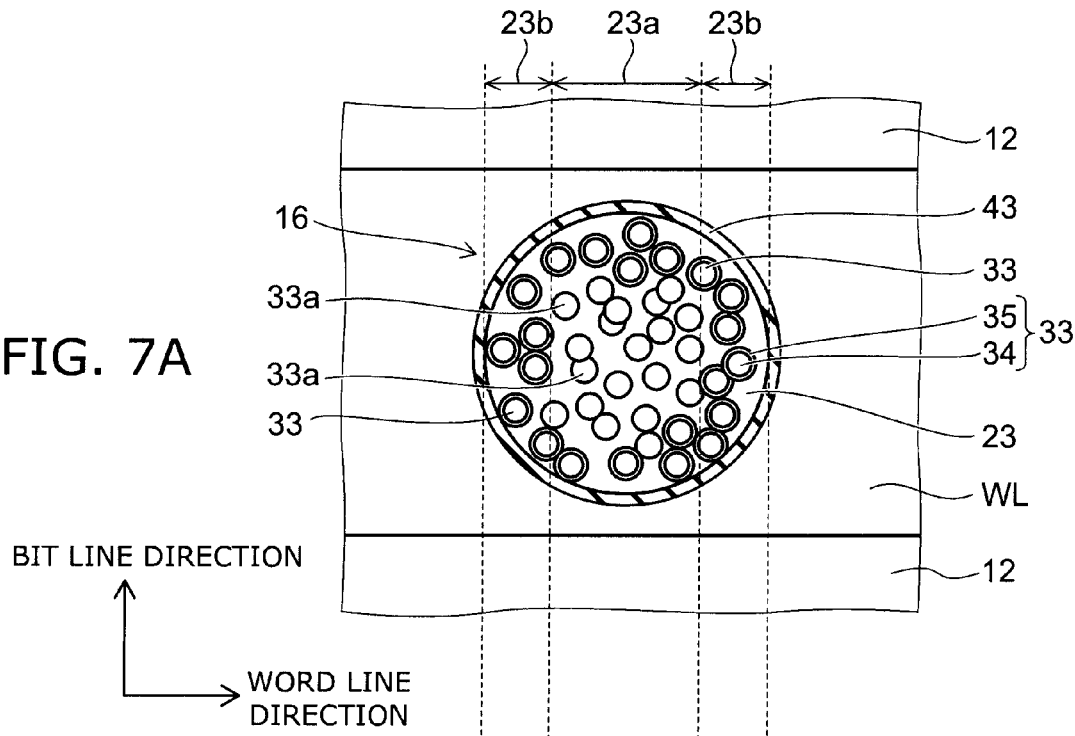
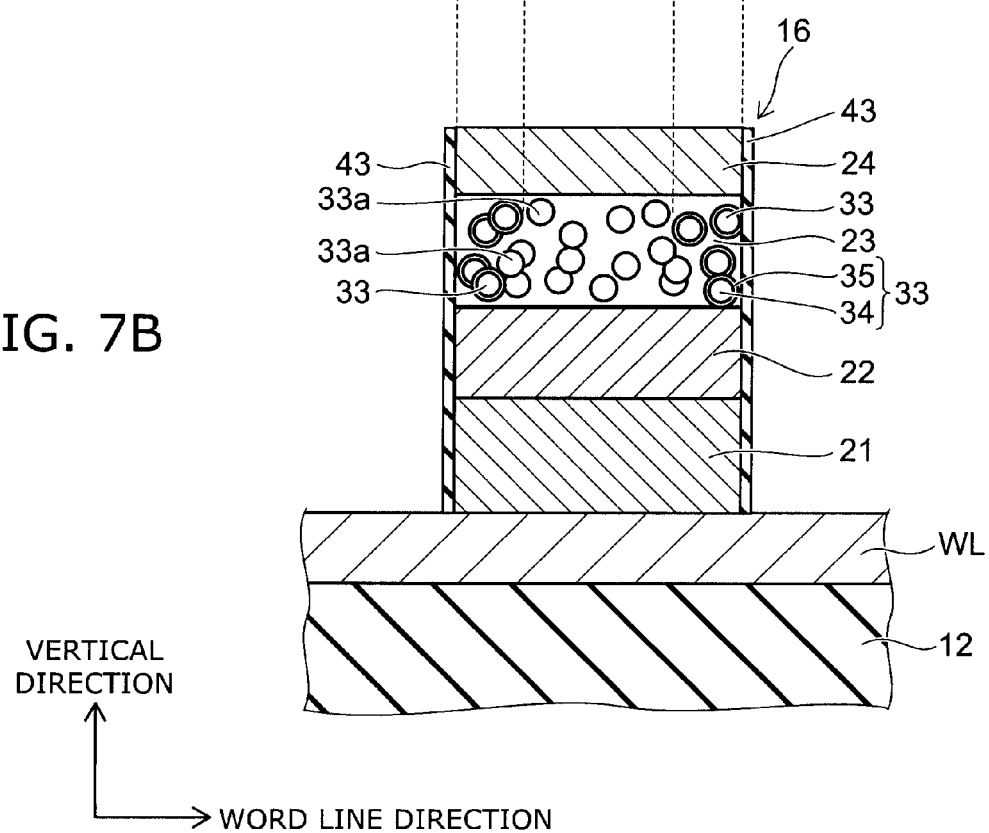

MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2010-235173, filed on Oct. 20, 2010; the entire contents of which are incorporated herein by reference.

FIELD

Embodiments described herein relate generally to a memory device and a method for manufacturing the same.

BACKGROUND

In recent years, a phenomenon was discovered in which certain metal oxide materials have two electrical states of a low and high resistance when a voltage is applied to the material due to the resistivity prior to the voltage application and the applied voltage height; and new memory devices utilizing such a phenomenon are drawing attention. Such a memory device is called ReRAM (Resistance Random Access Memory). Three-dimensional cross-point structures in which memory cells are disposed at the intersection points between WLs (word lines) and BLs (bit lines) have been proposed as the actual device structure of ReRAM from the viewpoint of higher integration. To realize products using ReRAM, it is necessary to increase the reliability.

BRIEF DESCRIPTION OF THE DRAWINGS

FIGS. 2A and 2B are schematic cross-sectional views illustrating the memory device according to the first embodiment;

FIGS. 7A and 7B are cross-sectional views of processes, illustrating the method for manufacturing the memory device according to the first embodiment;

DETAILED DESCRIPTION

In general, according to one embodiment, a memory device includes a selection element layer, a nanomaterial aggregate layer, and a fine particle. The nanomaterial aggregate layer is stacked on the selection element layer. The nanomaterial aggregate layer has a plurality of micro conductive bodies aggregated with an interposed gap. The fine particle has at least a surface made of silicon oxynitride. The fine particle is dispersed between the micro conductive bodies in one portion of the nanomaterial aggregate layer piercing the nanomaterial aggregate layer in a thickness direction.

According to another embodiment, a method is disclosed for manufacturing a memory device. The method can include forming a stacked body including a selection element layer stacked with a nanomaterial aggregate layer. The nanomaterial aggregate layer has a plurality of micro conductive bodies aggregated with an interposed gap. The nanomaterial aggregate layer has a fine particle made of silicon oxide dispersed between the micro conductive bodies. The method can include forming a pillar by selectively removing the stacked body. The method can include nitriding at least a surface of the fine particle dispersed in one portion of the nanomaterial aggregate layer piercing the nanomaterial aggregate layer in a thickness direction. In addition, the method can include using a chemical liquid to remove a by-product adhered to a side face of the pillar. The chemical liquid has a dissolution rate of the by-product greater than a dissolution rate of silicon oxynitride.

Embodiments of the invention will now be described with reference to the drawings.

First, a first embodiment will be described.

Figure 1:
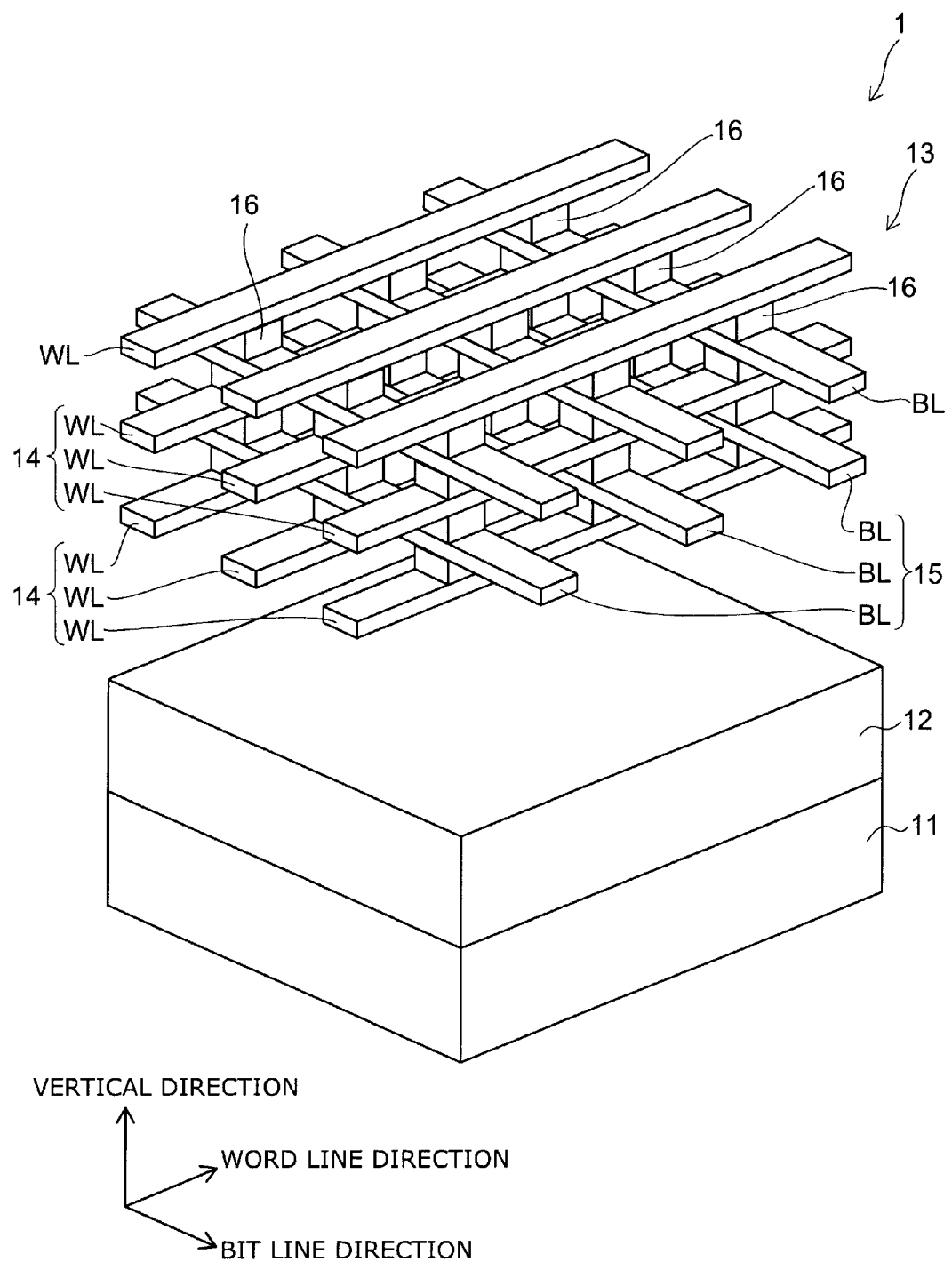
FIG. 1 is a perspective view illustrating a memory device according to a first embodiment.

FIG. 1 is a perspective view illustrating a memory device according to the embodiment.

FIGS. 2A and 2B are schematic cross-sectional views illustrating the memory device according to the embodiment. FIG. 2A illustrates a cross section as viewed from the vertical direction; and FIG. 2B illustrates a cross section as viewed from the bit line direction.

Figure 3:
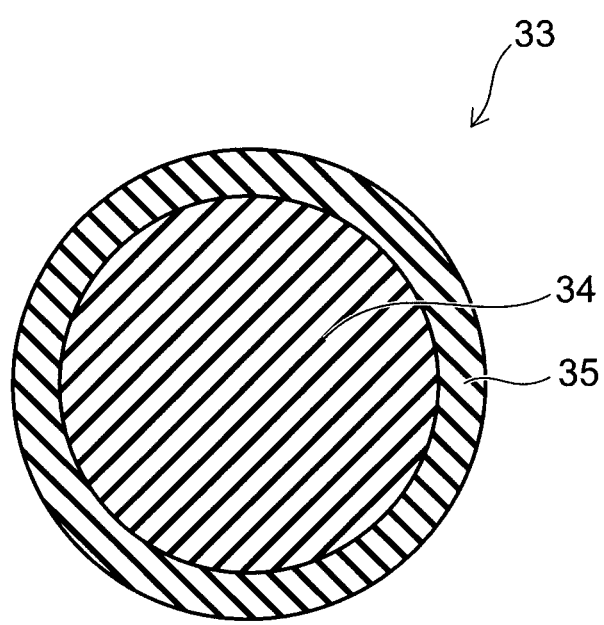
FIG. 3 is a cross-sectional view illustrating a fine particle of the first embodiment.

FIG. 3 is a cross-sectional view illustrating a fine particle of the embodiment.

The memory device according to the embodiment is a nonvolatile memory device and is a ReRAM.

In the memory device 1 according to the embodiment as illustrated in FIG. 1, a silicon substrate 11 is provided; and a drive circuit (not illustrated) of the memory device 1 is formed in the upper layer portion and on the upper face of the silicon substrate 11. An inter-layer insulating film 12 made of, for example, silicon oxide is provided on the silicon substrate 11 to bury the drive circuit; and a memory cell unit 13 is provided on the inter-layer insulating film 12.

In the memory cell unit 13, a word line interconnect layer 14 including multiple word lines WL extending in one direction (hereinbelow referred to as the "word line direction") parallel to the upper face of the silicon substrate 11 is stacked alternately with a bit line interconnect layer 15 including multiple bit lines BL extending in a direction (hereinbelow referred to as the "bit line direction") parallel to the upper face of the silicon substrate 11 and intersecting, e.g., being orthogonal to, the word line direction. The word lines WL do not contact each other; the bit lines BL do not contact each other; and the word lines WL do not contact the bit lines BL.

A pillar 16 extending in a direction (hereinbelow referred to as the "vertical direction") perpendicular to the upper face of the silicon substrate 11 is provided at the points where each of the word lines WL and each of the bit lines BL are most proximal. The pillar 16 has, for example, a circular columnar configuration, a quadrilateral columnar configuration, or a substantially quadrilateral columnar configuration having rounded corners; and the diameter thereof is about, for example, 50 nm. The pillar 16 is formed between the word line WL and the bit line BL; and one memory cell includes one pillar 16. In other words, the memory device 1 is a cross point device in which a memory cell is disposed at each of the points where the word lines WL and the bit lines BL are most proximal. An inter-layer insulating film 17 (referring to FIGS. 2A and 2B) is filled into the space between the word line WL, the bit line BL, and the pillar 16.

The configuration of the pillar 16 will now be described.

As illustrated in FIGS. 2A and 2B, each of the pillars 16 includes a selection element layer 21, a lower electrode layer 22, a nanomaterial aggregate layer 23, and an upper electrode layer 24 stacked in this order from the bottom upward. In other words, the thickness direction of each of the layers is the vertical direction described above. A sidewall 18 made of, for example, silicon nitride is provided on the side face of the pillar 16.

The word line WL may be disposed below the pillar 16 and the bit line BL may be disposed above the pillar 16; or the bit line BL may be disposed below the pillar 16 and the word line WL may be disposed above the pillar 16. Hereinbelow, an example is described in which the word line WL is disposed below the pillar 16 and the bit line BL is disposed above the pillar 16. The selection element layer 21 contacts the word line WL; and the upper electrode layer 24 contacts the bit line BL.

The selection element layer 21 is a layer configured to select whether or not to allow a current to flow in the pillar 16. The selection element layer 21 is a layer including, for example, silicon (Si) and is a silicon diode layer made of, for example, polysilicon. The selection element layer 21 includes an n-type layer of an $n^+$ conductivity type, an i-type layer made of an intrinsic semiconductor, and a p-type layer of a $p^+$ conductivity type stacked in order from the lower layer side. Thereby, the selection element layer 21 functions as a rectifying element that, for example, allows a current to flow only when a potential higher than that of the word line WL is supplied to the bit line BL and does not allow a current to flow in the reverse direction. It is sufficient for the selection element layer 21 to provide a rectifying effect; and the selection element layer 21 may not include silicon. The lower electrode layer 22 and the upper electrode layer 24 are formed of an electrically conductive material such as tungsten (W), titanium nitride (TiN), tungsten nitride (WN), tantalum nitride (TaN), titanium silicide (TiSi), etc.

The nanomaterial aggregate layer 23 is a layer in which CNTs (carbon nanotubes) 31 as the micro conductive bodies are aggregated with an interposed gap 32. The gap 32 is a layer including nitrogen gas ($N_2$) or hydrogen gas ($H_2$). Accordingly, the structure of the nanomaterial aggregate layer 23 is a hollow structure. The configuration of each of the CNTs 31 is cylindrical with a diameter of, for example, 2 to 3 nm and a length of, for example, 20 to 30 nm. The CNT 31 extends roughly in a horizontal direction, i.e., a direction parallel to the plane of the word line direction and the bit line direction. Although an example is illustrated in FIG. 2A in which the orientations of the CNTs 31 are substantially aligned along the word line direction, this is not limited thereto. The orientations of the CNTs 31 may be random inside the substantially horizontal plane. The number of stacks of the CNTs 31 in the thickness direction of the nanomaterial aggregate layer 23 is, for example, about several layers to several tens of layers.

A central portion 23a and an outer circumferential portion 23b are provided in the nanomaterial aggregate layer 23. Both the central portion 23a and the outer circumferential portion 23b pierce the nanomaterial aggregate layer 23 in the thickness direction (the vertical direction); and the outer circumferential portion 23b is disposed around the central portion 23a. For example, as viewed from the vertical direction, the central portion 23a has a circular configuration; and the outer circumferential portion 23b has a circular ring configuration. The central portion 23a is a portion including the central axis of the pillar 16; and the outer circumferential portion 23b is a portion of the nanomaterial aggregate layer 23 included in the outer circumferential portion of the pillar 16. In the outer circumferential portion 23b, fine particles 33 which are insulators are dispersed between the CNTs 31. On the other hand, the fine particles 33 are not dispersed in the central portion 23a. It is favorable for the proportion of the fine particles 33 in the nanomaterial aggregate layer 23 to be less than 50 atomic %. In other words, it is favorable for the total of the number of silicon atoms and the number of oxygen atoms included in the nanomaterial aggregate layer 23 to be less than half of the number of all of the atoms included in the nanomaterial aggregate layer 23. There is not a physical boundary between the central portion 23a and the outer circumferential portion 23b; and, for example, many of the CNTs 31 are disposed in both portions. The central portion 23a and the outer circumferential portion 23b are discriminated mainly by the existence or absence of the fine particles 33.

As illustrated in FIG. 3, the fine particle 33 includes a core portion 34 made of silicon oxide ($SiO_2$) and a surface layer portion 35 made of silicon oxynitride (SiON) covering the core portion 34. In other words, at least the surface of the fine particle 33 is formed of silicon oxynitride. The average particle size of the fine particles 33 is about, for example, 2 to 10 nm, e.g., about 6 nm. The thickness of the surface layer portion 35 is not less than, for example, 1 nm; and the content of nitrogen in the surface layer portion 35 is not less than 5 atomic %.

A method for manufacturing the memory device according to the embodiment will now be described.

FIG. 4A to FIG. 9B are cross-sectional views of processes, illustrating the method for manufacturing the memory device according to the embodiment. Drawing A of each of these drawings illustrates a cross section as viewed from the vertical direction; and drawing B of each of these drawings illustrates a cross section as viewed from the bit line direction.

In FIG. 4A to FIG. 9B, the CNTs 31 and the gap 32 (referring to FIGS. 2A and 2B) included in the nanomaterial aggregate layer 23 are not illustrated; and only the fine particles 33 and 33a are schematically illustrated.

First, as illustrated in FIG. 1, the drive circuit configured to drive the memory cell unit 13 is formed in the upper face of the silicon substrate 11. Then, the inter-layer insulating film 12 is formed on the silicon substrate 11. Then, the word line WL is formed on the inter-layer insulating film 12 using a damascene process or patterning. The word line interconnect layer 14 is formed of these multiple word lines WL.

Figure 4A:
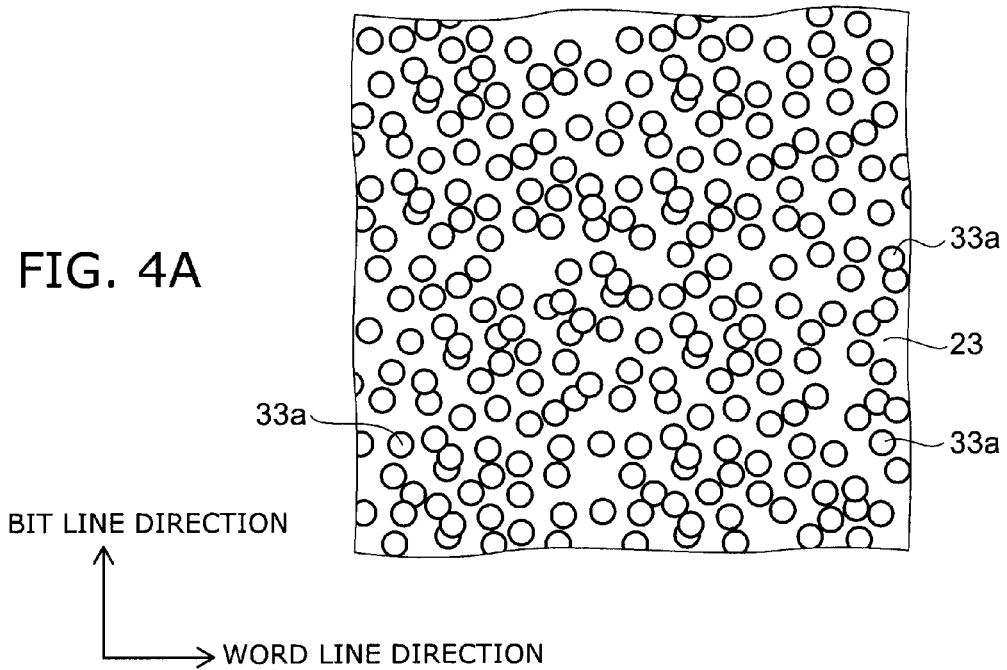
FIGS. 4A and 4B are cross-sectional views of processes, illustrating a method for manufacturing the memory device according to the first embodiment.
Figure 4B:
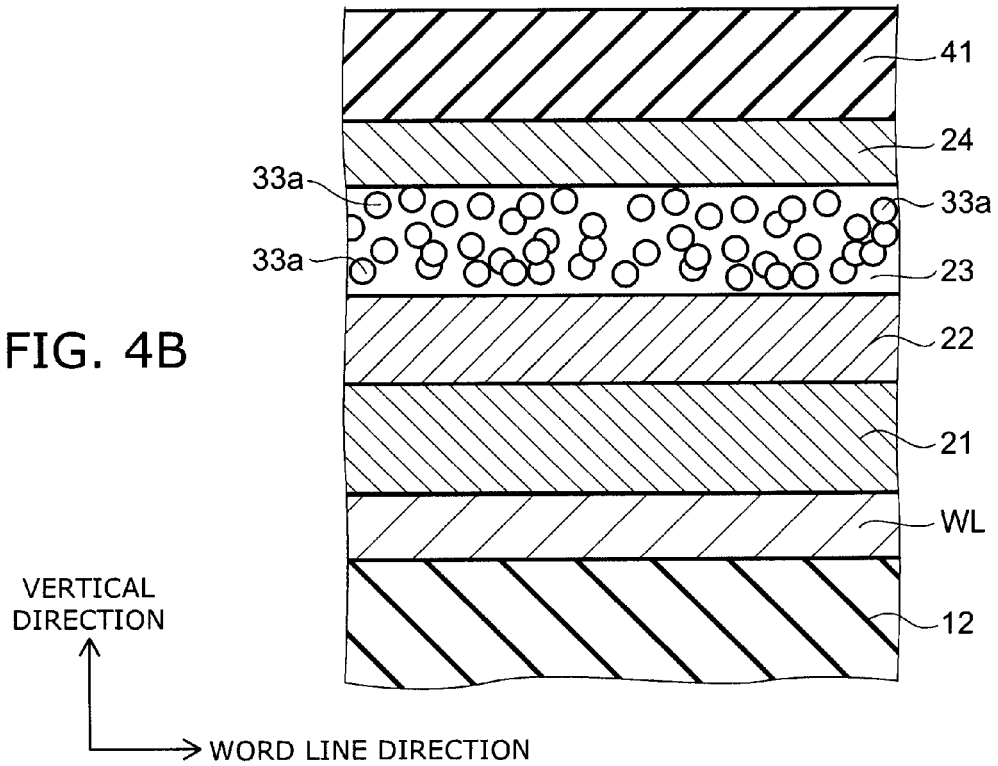

Then, as illustrated in FIGS. 4A and 4B, the selection element layer 21 is formed by, for example, depositing silicon while introducing an impurity on the word line WL. For example, a pin-type diode is formed by forming an n-type layer by depositing silicon while introducing an impurity used to form a donor such as phosphorus, forming an i-type layer by depositing silicon without introducing an impurity, and forming a p-type layer by depositing silicon while introducing an impurity used to form an acceptor such as boron. Then, the lower electrode layer 22 is formed by depositing, for example, tungsten (W).

Continuing, a dispersion solution in which the carbon nanotubes (the CNTs) 31 (referring to FIGS. 2A and 2B) and the fine particles 33a are dispersed in water is coated onto the lower electrode layer 22 and dried. At this stage, the surface of the fine particle 33a is not nitrided; and the entire fine particle 33a is formed of silicon oxide. The nanomaterial aggregate layer 23 is formed by multiply repeating the coating and the drying. In the nanomaterial aggregate layer 23, the multiple CNTs 31 (referring to FIGS. 2A and 2B) are loosely bonded; and the gap 32 (referring to FIGS. 2A and 2B) is formed between the CNTs 31. The direction in which the CNTs 31 extend approaches the horizontal direction as the dispersion solution dries and the thickness decreases. The fine particles 33a are dispersed between the CNTs 31.

Then, the upper electrode layer 24 is formed by depositing an electrically conductive material such as, for example, tungsten (W) on the nanomaterial aggregate layer 23. Although a portion of the electrically conductive material enters into the gap 32 (referring to FIGS. 2A and 2B) of the nanomaterial aggregate layer 23 at this time, the penetration of the electrically conductive material is suppressed because the fine particles 33a are dispersed inside the nanomaterial aggregate layer 23 and the gap 32 decreases by that amount. Then, a hard mask 41 made of, for example, silicon oxide is formed on the upper electrode layer 24. Thus, the stacked body including the selection element layer 21, the lower electrode layer 22, the nanomaterial aggregate layer 23, and the upper electrode layer 24 stacked in this order is formed on the word line interconnect layer 14.

Figure 5A:
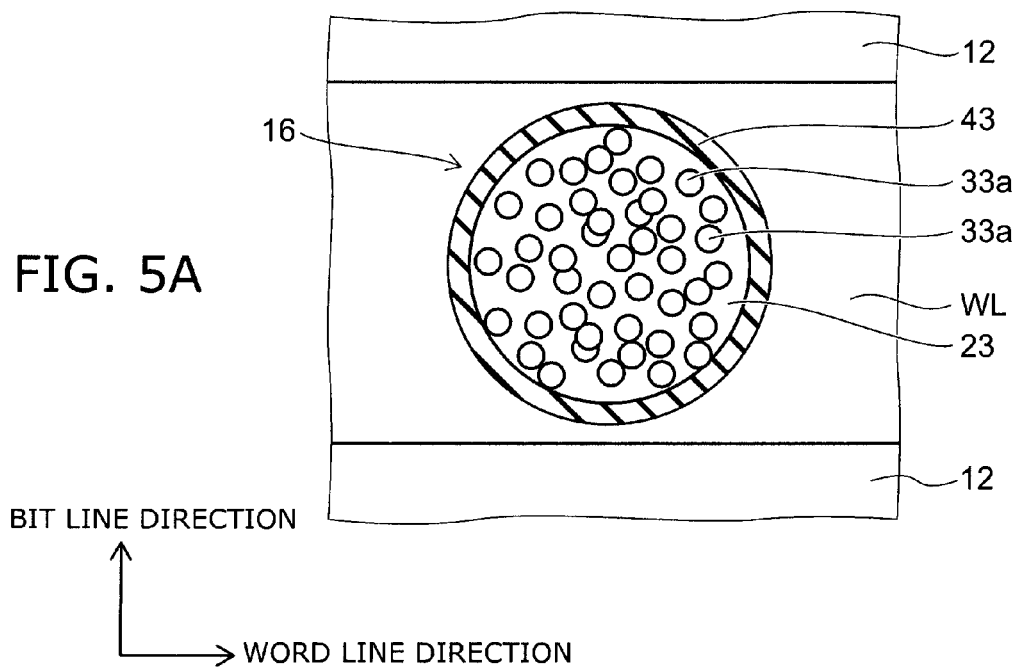
FIGS. 5A and 5B are cross-sectional views of processes, illustrating the method for manufacturing the memory device according to the first embodiment.
Figure 5B:
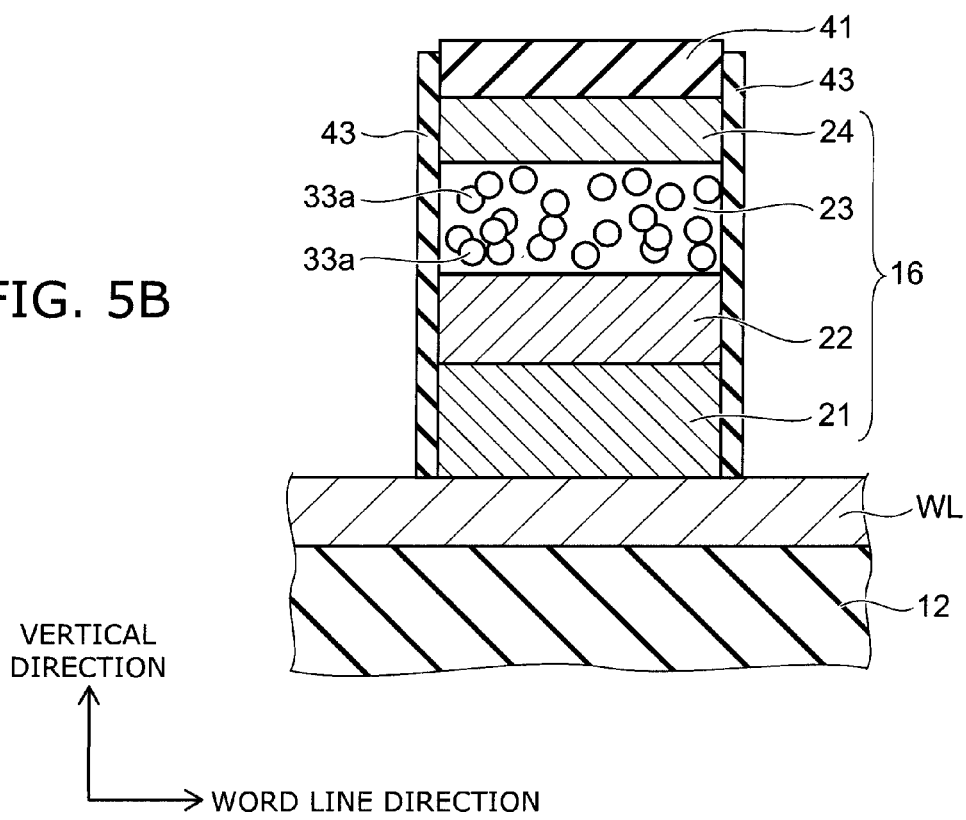

Continuing as illustrated in FIGS. 5A and 5B, a resist film is formed on the hard mask 41; and a resist pattern (not illustrated) is formed by patterning the resist film into a matrix configuration using lithography. Then, etching is performed by RIE (reactive ion etching) and the like using the resist pattern as a mask to transfer the pattern of the resist pattern onto the hard mask 41. Then, patterning is performed by RIE using the resist pattern and the hard mask 41 as a mask to selectively remove the upper electrode layer 24, the nanomaterial aggregate layer 23, the lower electrode layer 22, and the selection element layer 21. Thereby, the pillar 16 is formed. The entire resist pattern and a portion of the hard mask 41 vanish in the RIE. At this time, a by-product (a deposit) 43 having a main component of silicon oxide is adhered to the side face of the pillar 16. Even in the case where the selection element layer 21 does not include silicon, a by-product 43 that has a main component of an oxide of, for example, a metal included in the selection element layer 21, etc., adheres.

Figure 6A:
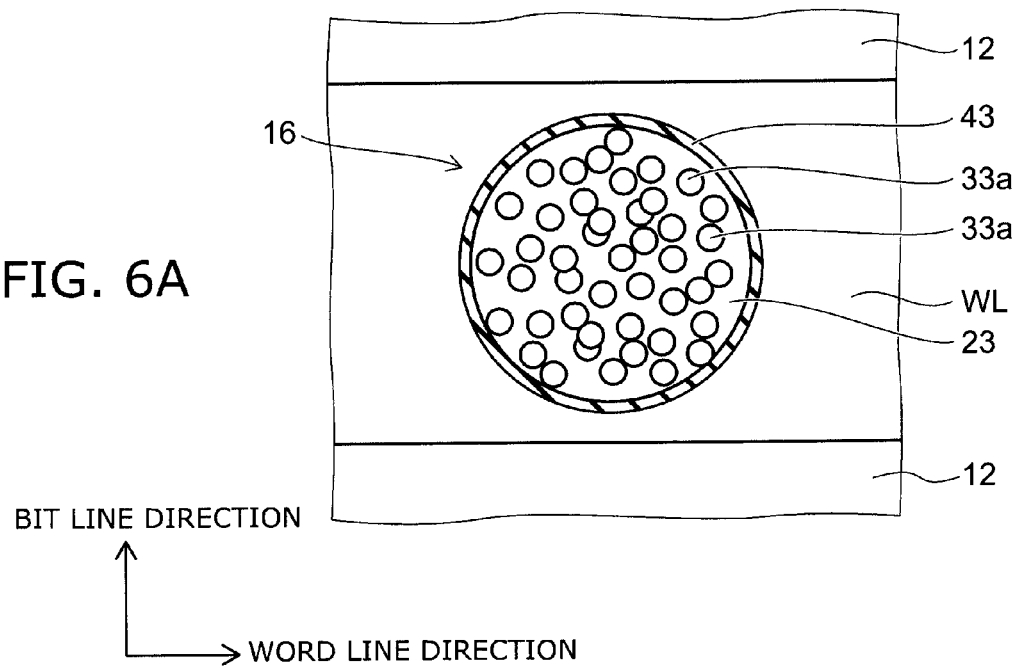
FIGS. 6A and 6B are cross-sectional views of processes, illustrating the method for manufacturing the memory device according to the first embodiment.
Figure 6B:
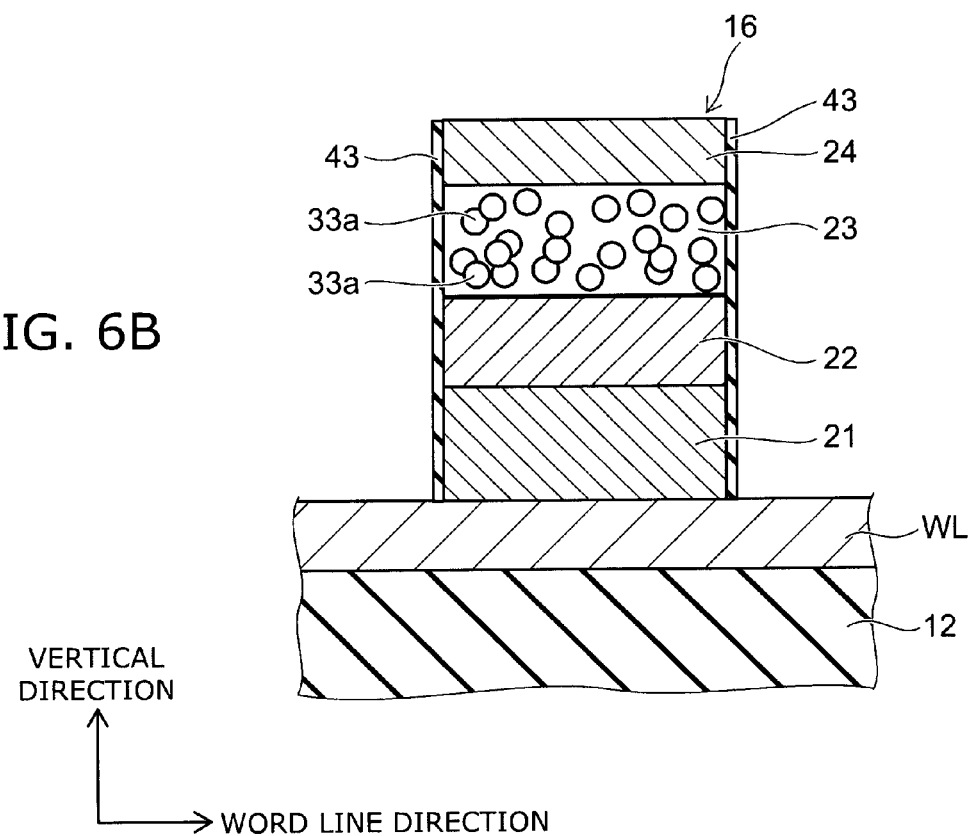

Then, as illustrated in FIGS. 6A and 6B, the pillar 16 is cleaned by water or a chemical liquid such as dilute hydrochloric acid or dilute sulfuric acid. Thereby, a portion of the by-product 43 is removed. The fine particles 33a substantially are not removed in this cleaning process.

Continuing as illustrated in FIGS. 7A and 7B, thermal nitriding is performed using ammonia ($NH_3$) gas at a temperature of not more than 500° C. The ammonia gas penetrates into the nanomaterial aggregate layer 23 from the side face of the pillar 16. At this time, the temperature of the gas, the pressure, the flow rate, the time of the thermal nitriding, etc., are adjusted such that the ammonia gas enters only into the outer circumferential portion 23b of the nanomaterial aggregate layer 23 and does not enter into the central portion 23a. Thereby, the surfaces of the fine particles 33a dispersed in the outer circumferential portion 23b of the nanomaterial aggregate layer 23 are nitrided to form the surface layer portions 35 (referring to FIG. 3) made of silicon oxynitride. As a result, the fine particles 33a dispersed in the outer circumferential portion 23b change into the fine particles 33.

Thereby, the fine particles 33 including the core portion 34 (referring to FIG. 3) made of silicon oxide and the surface layer portion 35 (referring to FIG. 3) made of silicon oxynitride are dispersed inside the outer circumferential portion 23b of the nanomaterial aggregate layer 23. On the other hand, the fine particles 33a entirely made of silicon oxide are dispersed in the central portion 23a. The carbon atoms included in the CNTs 31 are securely bonded to other carbon atoms and therefore substantially are not nitrided and removed.

Figure 8A:
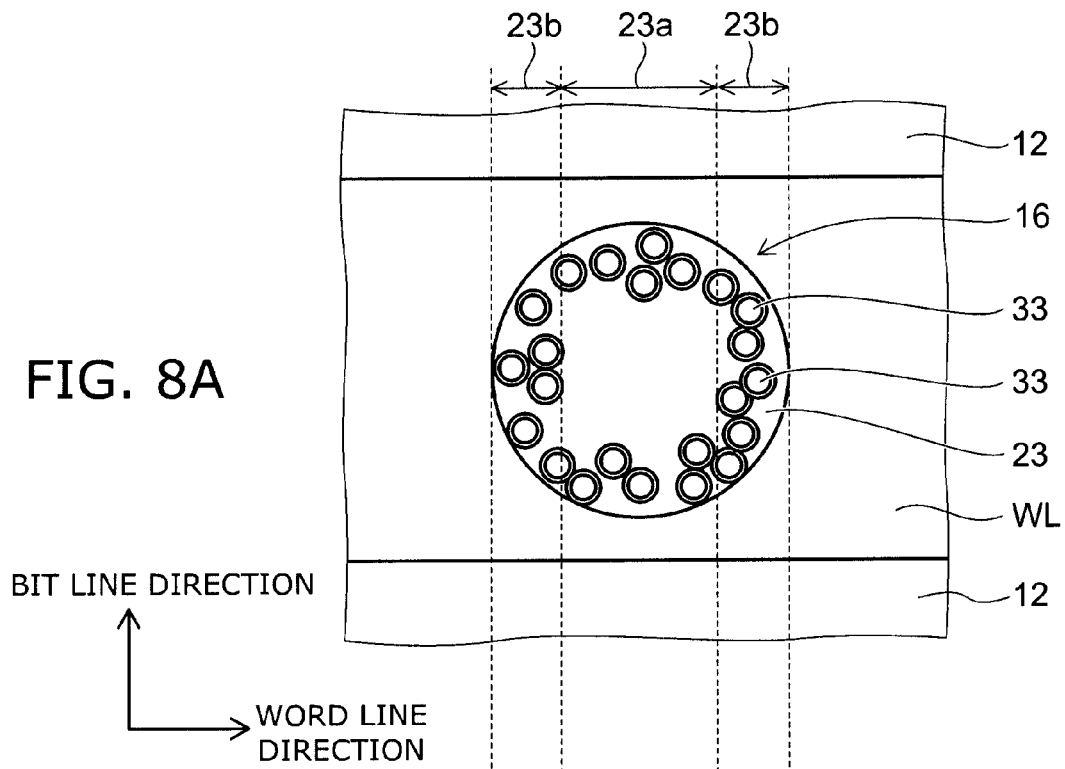
FIGS. 8A and 8B are cross-sectional views of processes, illustrating the method for manufacturing the memory device according to the first embodiment.
Figure 8B:
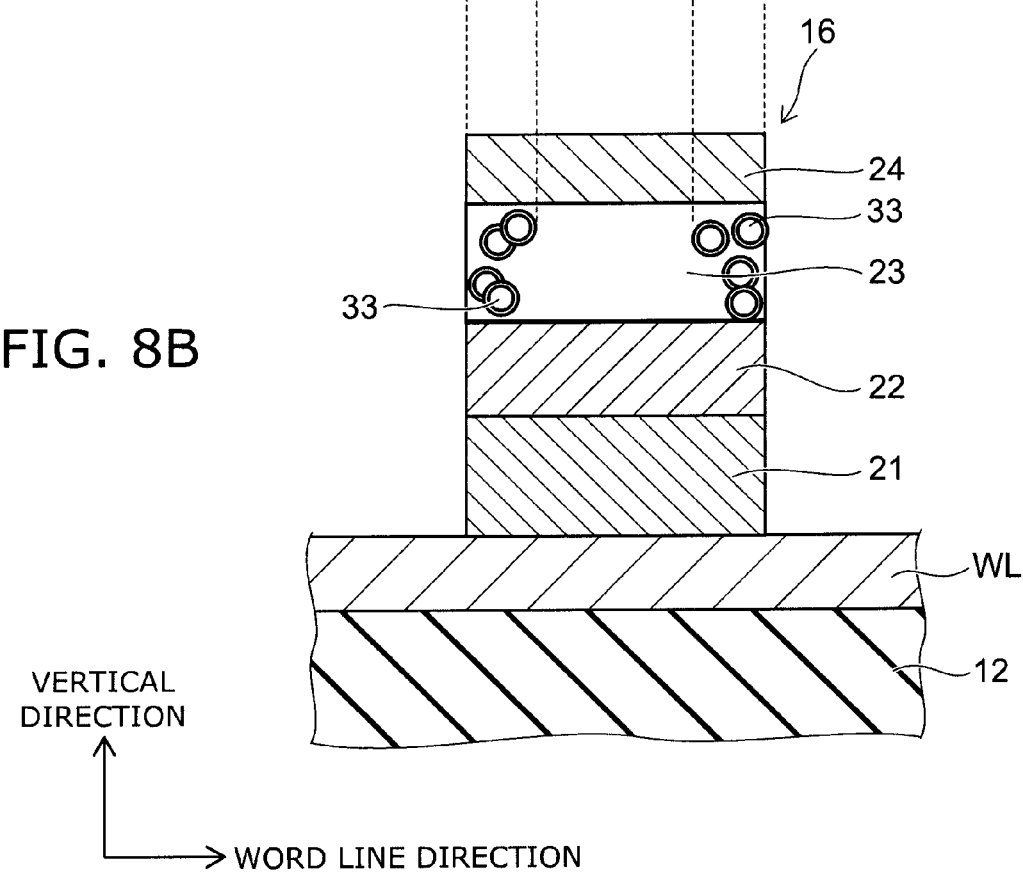

Then, as illustrated in FIGS. 8A and 8B, the by-product 43 (referring to FIGS. 7A and 7B) is removed by performing wet cleaning using, for example, a hydrofluoric acid-based chemical liquid, e.g., DHF (diluted hydrofluoric acid) or BHF (buffered hydrofluoric acid). Although the chemical liquid enters also into the nanomaterial aggregate layer 23 to dissolve the silicon oxide at this time, the fine particles 33a are dissolved by the chemical liquid and removed because the fine particles 33a are entirely formed of silicon oxide. On the other hand, the fine particles 33 are not dissolved by the hydrofluoric acid-based chemical liquid and are not removed because the surfaces of the fine particles 33 are formed of silicon oxynitride. As a result, although the fine particles 33a of the central portion 23a of the nanomaterial aggregate layer 23 are removed, the fine particles 33 of the outer circumferential portion 23b remain. The hard mask 41 also vanishes due to this wet cleaning. A portion of the hard mask 41 may remain.

Although the chemical liquid used to remove the by-product 43 is not limited to the hydrofluoric acid-based chemical liquid in this process, it is necessary to use a chemical liquid having a dissolution rate of the by-product 43 greater than the dissolution rate of silicon oxynitride. For example, in the case where the main component of the by-product 43 is silicon oxide, the chemical liquid is a chemical liquid having a dissolution rate of silicon oxide greater than the dissolution rate of silicon oxynitride.

Figure 9A:
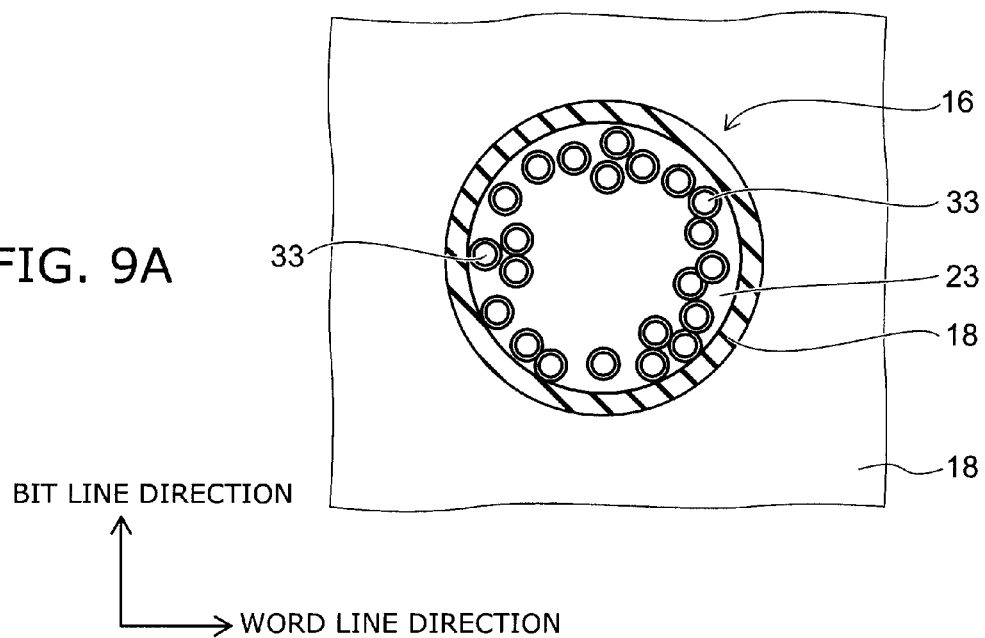
FIGS. 9A and 9B are cross-sectional views of processes, illustrating the method for manufacturing the memory device according to the first embodiment.
Figure 9B:
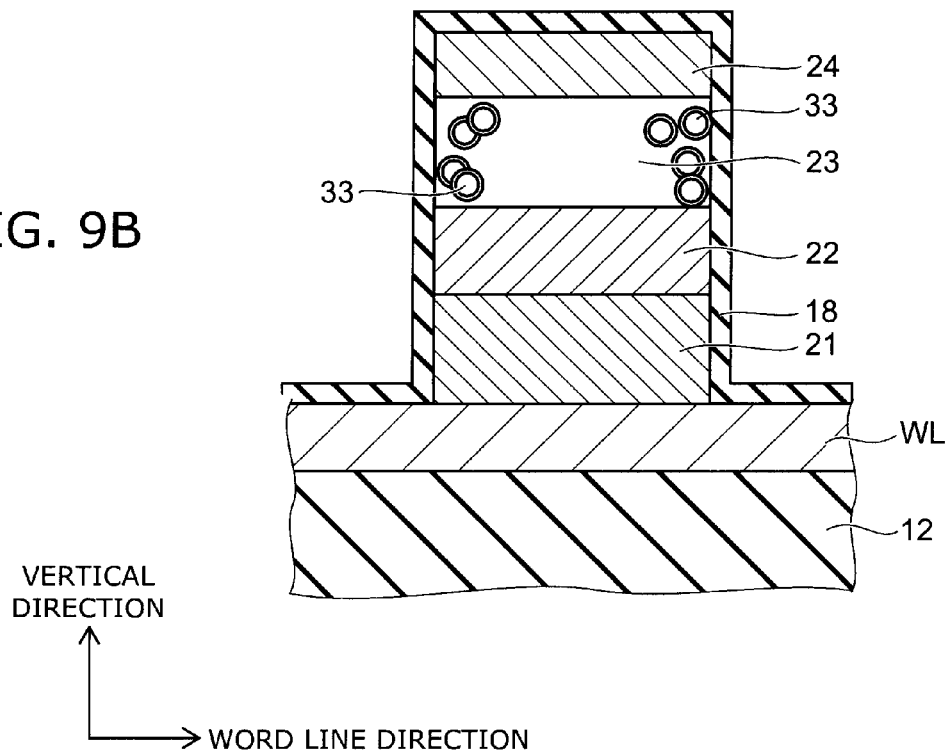

Then, as illustrated in FIGS. 9A and 9B, the side wall 18 is formed on the side face of the pillar 16, etc., by depositing silicon nitride onto the entire surface. The thickness of the side wall 18 is not more than, for example, 5 nm.

Continuing as illustrated in FIGS. 2A and 2B, the inter-layer insulating film 17 is formed by depositing, for example, silicon oxide between the pillars 16. The CNTs 31 are not oxidized by the side face of the pillar 16 being exposed to an oxidation atmosphere when the silicon oxide is deposited because the side face of the pillar 16 is covered with the side wall 18 at this time. Then, the upper face of the inter-layer insulating film 17 is planarized by performing CMP (chemical mechanical polishing) using the upper electrode layer 24 as a stopper. At this time, the upper electrode layer 24 is exposed at the upper face of the inter-layer insulating film 17.

Then, as illustrated in FIG. 1 to FIG. 2A, the multiple bit lines BL are formed on the upper electrode layer 24 using a damascene process or patterning. The bit line interconnect layer 15 is formed of the multiple bit lines BL extending in the bit line direction. Then, methods similar to those described above are used to form the pillar 16 by stacking the selection element layer 21, the lower electrode layer 22, the nanomaterial aggregate layer 23, and the upper electrode layer 24 in this order and patterning. However, when forming the pillar 16 on the word line WL described above, the stacking order of the n-type layer, the i-type layer, and the p-type layer of the selection element layer 21 is reversed. Then, the cleaning processing illustrated in FIGS. 6A and 6B, the nitriding illustrated in FIGS. 7A and 7B, the removal of the by-product 43 illustrated in FIGS. 8A and 8B, and the formation of the side wall 18 illustrated in FIGS. 9A and 9B are implemented in this order; and subsequently, the inter-layer insulating film 17 is filled between the pillars 16. Thereafter, similar methods may be used to repeatedly form the word line interconnect layer 14, the multiple pillars 16, the bit line interconnect layer 15, and the multiple pillars 16. Thereby, the memory device 1 according to the embodiment is manufactured.

Operations of the embodiment will now be described.

In the memory device 1 according to the embodiment, the nanomaterial aggregate layer 23 can have two states of a high resistance state and a low resistance state. The mechanism, while not completely elucidated, is considered to be, for example, as follows.

When a voltage is not applied between the lower electrode layer 22 and the upper electrode layer 24, the CNTs 31 of the nanomaterial aggregate layer 23 are roughly in a state of being isolated from each other; and the nanomaterial aggregate layer 23 is in the "high resistance state." On the other hand, when a voltage is applied between the lower electrode layer 22 and the upper electrode layer 24, Coulomb forces occur between the CNTs 31; and the CNTs 31 attract each other. Then, when the voltage is continuously applied for a constant amount of time, the CNTs 31 move and rotate due to the Coulomb forces and contact adjacent CNTs 31; and a current path is formed between the lower electrode layer 22 and the upper electrode layer 24 via the multiple CNTs 31. As a result, the nanomaterial aggregate layer 23 is switched to the "low resistance state." This state is maintained even when the voltage is no longer applied between the lower electrode layer 22 and the upper electrode layer 24. When a short pulse voltage, e.g., on the order of nanoseconds, is applied between the lower electrode layer 22 and the upper electrode layer 24, the contact portions between the CNTs 31 generate heat; and the CNTs 31 separate from each other. As a result, the nanomaterial aggregate layer 23 returns to the "high resistance state." Thus, the nanomaterial aggregate layer 23 can have the two states of the "high resistance state" and the "low resistance state." Thereby, binary data can be stored.

Effects of the embodiment will now be described.

According to the embodiment, a resistance change layer is realized by the nanomaterial aggregate layer 23 including the aggregated carbon nanotubes (the CNTs) 31. Thereby, a ReRAM is realized. In conventional resistance change layers using metal oxides, operations were unfortunately unstable because metal oxides normally are insulators. Conversely, according to the embodiment, it is possible to drive with a low voltage and the operations are stable because the resistance change layer is formed using CNTs which are conductors. Thereby, a memory device having high reliability can be realized.

The fine particles 33a are dispersed inside the nanomaterial aggregate layer 23 when the nanomaterial aggregate layer 23 is formed in the process illustrated in FIGS. 4A and 4B of the embodiment. Thereby, a decrease of the gap can be suppressed; and permeation of the electrically conductive material of the upper electrode layer 24 into the nanomaterial aggregate layer 23 can be suppressed when forming the upper electrode layer 24 on the nanomaterial aggregate layer 23. As a result, the interface between the nanomaterial aggregate layer 23 and the upper electrode layer 24 can be stably formed to be flat.

Because the fine particles 33a are dispersed inside the nanomaterial aggregate layer 23, the bonding force between the CNTs 31 increases; and the nanomaterial aggregate layer 23 is strong. As a result, a collapse of the pillar 16 can be prevented in the process of forming the pillar 16 illustrated in FIGS. 5A and 5B. Thereby, the stability of the configuration of the memory device 1 can be increased. As a result, the reliability can be increased.

Also, the pillar 16 is cleaned in the process illustrated in FIGS. 6A and 6B of the embodiment. Thereby, a portion of the by-product 43 can be removed substantially without loss of the fine particles 33a. As a result, the fine particles 33a can be effectively nitrided in the nitriding process (referring to FIGS. 7A and 7B) continuing from the cleaning process.

In the embodiment, only the fine particles 33a dispersed in the outer circumferential portion 23b are nitrided to become the fine particles 33 in the process illustrated in FIGS. 7A and 7B; and subsequently, wet cleaning is performed using the hydrofluoric acid-based chemical liquid in the process illustrated in FIGS. 8A and 8B. Thereby, the un-nitrided fine particles 33a are eluted while removing the by-product 43. As a result, the fine particles 33 having nitrided surfaces remain in the outer circumferential portion 23b of the nanomaterial aggregate layer 23; and the fine particles vanish from the central portion 23a.

Thereby, the outer circumferential portion 23b has a high mechanical strength and can support the entire nanomaterial aggregate layer 23 because the fine particles 33 are dispersed in the outer circumferential portion 23b. As a result, the collapse of the pillar 16 can be prevented. On the other hand, the CNTs 31 move easily and the switching is easy between the high resistance state and the low resistance state because the fine particles are not dispersed in the central portion 23a. Therefore, the time necessary for switching the resistance state is shorter while the drive voltage necessary for the switching is lower. In the case where the drive voltage can be low, the selection element layer 21 can be thin and the formation of the pillar 16 is easier. In the case where the time necessary for switching the resistance state is short, the operation speed of the memory device 1 can be increased.

If the fine particles 33a are not dispersed when forming the nanomaterial aggregate layer 23 in the process illustrated in FIGS. 4A and 4B, the mechanical strength of the nanomaterial aggregate layer 23 is lower. Therefore, there are cases where the pillar 16 undesirably collapses during the patterning of the pillar 16 in the process illustrated in FIGS. 5A and 5B. As a result, the reliability of the memory device 1 decreases. Even in the case where the fine particles 33a are dispersed in the entire nanomaterial aggregate layer 23, the fine particles 33a also may be undesirably removed and the pillar 16 collapses more easily when removing the by-product 43 by the hydrofluoric acid-based chemical liquid in the process illustrated in FIGS. 8A and 8B if the nitriding is not performed in the process illustrated in FIGS. 7A and 7B. On the other hand, in the case where the fine particles 33a of the entire nanomaterial aggregate layer 23 are nitrided to remain as the fine particles 33, the movement of the CNTs 31 is undesirably constrained; and the resistance state of the nanomaterial aggregate layer 23 does not change easily. Therefore, the reliability of the operations of the memory device 1 decreases. Also, a high drive voltage is necessary to perform the resistance change of the nanomaterial aggregate layer 23; and the design of portions other than the nanomaterial aggregate layer 23 is constrained. For example, it becomes necessary to make the selection element layer 21, which is a pin-type diode, thicker to ensure the breakdown voltage of the reverse direction. Further, in the case where the by-product 43 is not removed, there are cases where a leak current undesirably flows via the by-product 43 and the memory cell does not operate normally.

Conversely, in the nanomaterial aggregate layer 23 according to the embodiment, both the mechanical strength and the resistance change operation can be achieved by the fine particles 33 being dispersed only in one portion of the nanomaterial aggregate layer 23 piercing the nanomaterial aggregate layer 23 in the thickness direction, i.e., the outer circumferential portion 23b, and by the fine particles 33 not being dispersed in one other portion of the nanomaterial aggregate layer 23 piercing the nanomaterial aggregate layer 23 in the thickness direction, i.e., the central portion 23a.

A second embodiment will now be described.

Figure 10A:
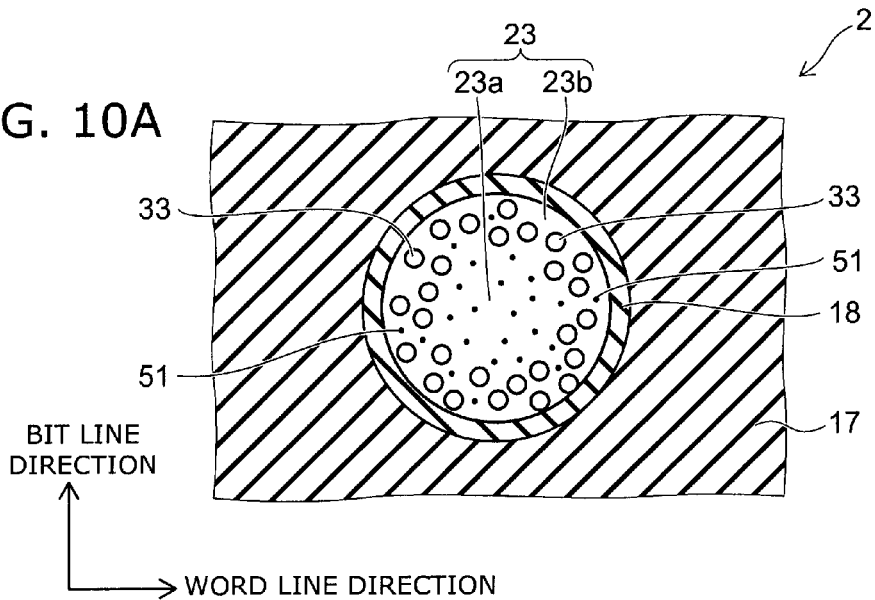
FIGS. 10A and 10B are schematic cross-sectional views illustrating a memory device according to a second embodiment.
Figure 10B:
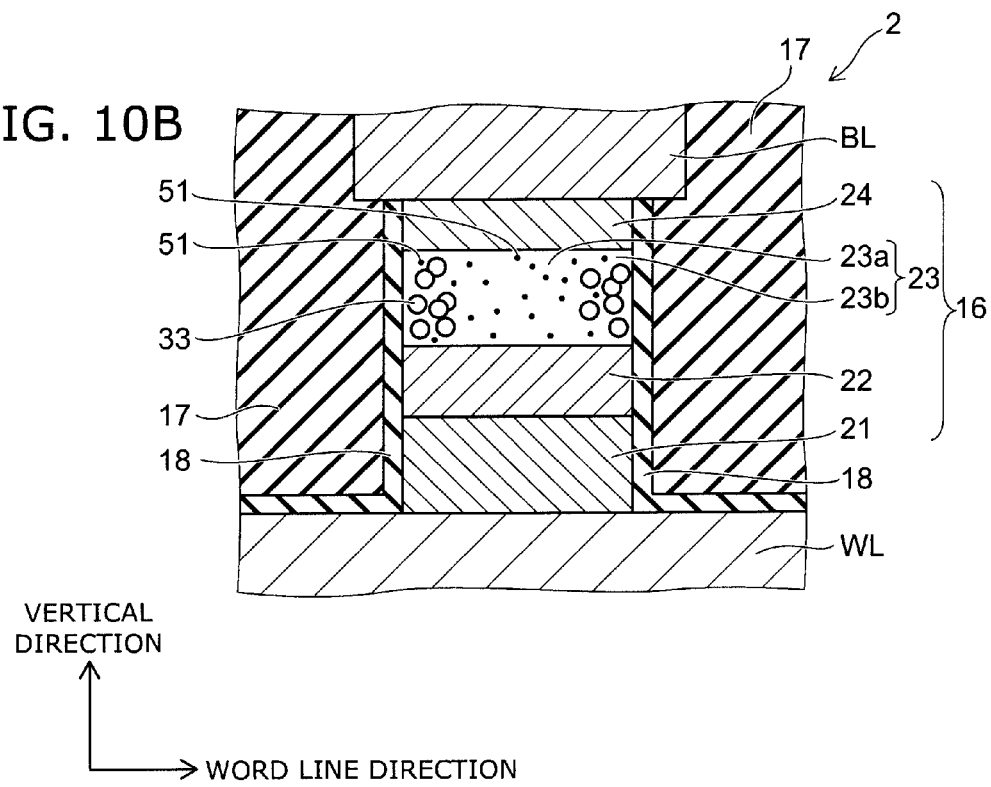

FIGS. 10A and 10B are schematic cross-sectional views illustrating a memory device according to the embodiment. FIG. 10A illustrates a cross section as viewed from the vertical direction; and FIG. 10B illustrates a cross section as viewed from the bit line direction.

In FIGS. 10A and 10B, the CNTs 31 and the gap 32 (referring to FIGS. 2A and 2B) included in the nanomaterial aggregate layer 23 are not illustrated; and only the fine particles 33 and amorphous carbon 51 are schematically illustrated.

As illustrated in FIGS. 10A and 10B, the memory device 2 according to the embodiment differs from the memory device 1 (referring to FIGS. 2A and 2B) according to the first embodiment described above in that the nanomaterial aggregate layer 23 contains the amorphous carbon 51. Otherwise, the configuration of the embodiment is similar to that of the first embodiment described above.

A method for manufacturing the memory device according to the embodiment will now be described.

When forming the nanomaterial aggregate layer 23 in the process illustrated in FIGS. 4A and 4B of the embodiment, the dispersion solution in which the CNTs 31 (referring to FIGS. 2A and 2B) and the fine particles 33a are dispersed in water contains the amorphous carbon 51 (referring to FIGS. 10A and 10B). Although a portion of the amorphous carbon 51 included in the outer circumferential portion 23b is nitrided and removed in the nitriding process illustrated in FIGS. 7A and 7B, the greater part of the amorphous carbon 51 remains as-is. Otherwise, the manufacturing method of the embodiment is similar to that of the first embodiment described above.

In the memory device 2 according to the embodiment, the electrical resistance value of the nanomaterial aggregate layer 23 is lower and the mechanical strength of the nanomaterial aggregate layer 23 is higher than in the memory device 1 (referring to FIGS. 2A and 2B) according to the first embodiment described above because the nanomaterial aggregate layer 23 contains the amorphous carbon 51.

When cleaning the pillar 16 in the process illustrated in FIGS. 6A and 6B, the amorphous carbon 51 can suppress the elution of the fine particles 33a more reliably. Otherwise, the effects of the embodiment are similar to those of the first embodiment described above. Instead of being included in the dispersion solution, the amorphous carbon 51 may be mixed into the nanomaterial aggregate layer 23 using vapor deposition such as CVD (chemical vapor deposition) after forming the nanomaterial aggregate layer 23.

In the first and second embodiments described above, the process of nitriding the surfaces of the fine particles 33a illustrated in FIGS. 7A and 7B may be performed using plasma nitriding rather than the thermal nitriding. In such a case, the plasma may include, for example, an ammonia plasma. The temperature of the plasma, the input power, the pressure, the flow rate of the ammonia gas, the processing time, etc., can be adjusted such that the plasma penetrates only into the outer circumferential portion 23b of the nanomaterial aggregate layer 23. For example, increasing the pressure inside the processing chamber makes it difficult for the plasma to penetrate to the central portion 23a; and only the fine particles 33a dispersed in the outer circumferential portion 23b can be nitrided. For example, the surface layer portions of the fine particles 33a dispersed in the outer circumferential portion 23b can be nitrided using a temperature of 300 to 400° C., an input power for the plasma generation of 300 W, a pressure of 20 Pa, and a time of 2 minutes.

A barrier metal layer may be interposed between each of the layers of the pillar 16 to prevent diffusion, increase the adhesion, etc. The barrier metal layer may be formed of, for example, titanium nitride (TiN), tantalum nitride (TaN), etc.

According to the embodiments described above, a memory device having high reliability and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device, comprising:
a selection element layer;
a nanomaterial aggregate layer stacked on the selection element layer, the nanomaterial aggregate layer having a plurality of micro conductive bodies aggregated with an interposed gap, the plurality of micro conductive bodies being disposed throughout a whole of the nanomaterial aggregate layer; and
a fine particle having at least a surface made of silicon oxynitride,
the selection element layer and the nanomaterial aggregate layer being a portion of a pillar extending in a thickness direction,
the fine particle being dispersed between the plurality of micro conductive bodies of the nanomaterial aggregate layer,
the fine particle being dispersed within an outer circumferential portion of the pillar, and
the fine particle not being dispersed within a central portion of the pillar inside of the outer circumferential portion of the pillar, and
the nanomaterial aggregate layer extending throughout the outer circumferential portion of the pillar and the central portion of the pillar.

2. The device according to claim 1, further comprising:
a word line interconnect layer including a plurality of word lines extending in a first direction; and
a bit line interconnect layer including a plurality of bit lines extending in a second direction intersecting the first direction,
the word line interconnect layer and the bit line interconnect layer being stacked alternately along the thickness direction,
the pillar being disposed between each of the plurality of word lines and each of the plurality of bit lines.

3. The device according to claim 1, further comprising a side wall including silicon nitride provided on a side face of the pillar.

4. The device according to claim 1, wherein the plurality of micro conductive bodies are carbon nanotubes.

5. The device according to claim 1, wherein the nanomaterial aggregate layer contains amorphous carbon.

6. The device according to claim 1, wherein the selection element layer is a silicon diode layer.

7. The device according to claim 1, wherein
the fine particle includes:
a core portion made of silicon oxide; and a surface layer portion made of silicon oxynitride covering the core portion.

* * * * *